(12) United States Patent
Kamimura et al.

(10) Patent No.: US 7,890,682 B2
(45) Date of Patent: Feb. 15, 2011

(54) SEMICONDUCTOR STORAGE DEVICE AND STORAGE SYSTEM

(75) Inventors: Takeshi Kamimura, Kanagawa (JP); Norihiko Kuroishi, Kanagawa (JP); Masao Funada, Kanagawa (JP); Jun Kitamura, Kanagawa (JP); Kunihiro Seno, Kanagawa (JP); Seiji Suzuki, Kanagawa (JP); Shinobu Ozeki, Kanagawa (JP); Masaru Kijima, Kanagawa (JP); Junji Okada, Kanagawa (JP); Yoshihide Sato, Kanagawa (JP); Kenichi Kobayashi, Kanagawa (JP)

(73) Assignee: Fuji Xerox Co., Ltd., Tokyo (JP)

( * ) Notice: Subject to any disclaimer, the term of this patent is extended or adjusted under 35 U.S.C. 154(b) by 382 days.

(21) Appl. No.: 11/505,267

(22) Filed: Aug. 16, 2006

(65) Prior Publication Data

US 2007/0168584 A1    Jul. 19, 2007

(30) Foreign Application Priority Data

Jan. 16, 2006   (JP) .......................... P2006-007718

(51) Int. Cl.
   *G06F 13/00*   (2006.01)
(52) U.S. Cl. .......................... 710/100; 710/15; 710/19; 710/62; 710/300; 710/305; 710/314; 714/25; 714/42; 714/43; 714/48; 711/100; 711/117; 711/118
(58) Field of Classification Search ..................... 710/62
   See application file for complete search history.

(56) References Cited

U.S. PATENT DOCUMENTS

| 5,845,061 | A | | 12/1998 | Miyamoto et al. ............. 714/4 |
|---|---|---|---|---|
| 6,446,141 | B1 | * | 9/2002 | Nolan et al. .................... 710/8 |
| 6,496,878 | B1 | * | 12/2002 | Azevedo et al. ............... 710/22 |
| 6,751,703 | B2 | * | 6/2004 | Chilton ...................... 711/113 |
| 6,816,917 | B2 | * | 11/2004 | Dicorpo et al. ................ 710/5 |
| 6,938,188 | B1 | * | 8/2005 | Kelleher ...................... 714/43 |
| 7,181,578 | B1 | * | 2/2007 | Guha et al. ................. 711/154 |
| 7,334,064 | B2 | * | 2/2008 | Davies et al. ................ 710/62 |
| 7,370,243 | B1 | * | 5/2008 | Grohoski et al. ............. 714/48 |
| 7,444,540 | B2 | * | 10/2008 | Shaw ............................ 714/5 |
| 7,571,356 | B2 | * | 8/2009 | Inoue et al. .................. 714/42 |
| 7,702,823 | B2 | * | 4/2010 | Hosoya et al. ............... 710/15 |
| 2003/0033573 | A1 | * | 2/2003 | Tamura et al. ............. 714/763 |
| 2004/0064590 | A1 | * | 4/2004 | Starr et al. .................. 709/250 |
| 2004/0078508 | A1 | * | 4/2004 | Rivard .......................... 711/4 |
| 2004/0193808 | A1 | * | 9/2004 | Spencer ..................... 711/142 |

(Continued)

FOREIGN PATENT DOCUMENTS

JP    08-153014    6/1996

OTHER PUBLICATIONS

'An Introducton to InfiniBand' by JNI Corporation, copyright 2001.*

(Continued)

*Primary Examiner*—Henry W Tsai
*Assistant Examiner*—Steven G Snyder
(74) *Attorney, Agent, or Firm*—Fildes & Outland, P.C.

(57) ABSTRACT

A semiconductor storage device includes an external input/output port. A system bus of a server, which is extended to outside of the server, is connected to the external input/output port directly as a serial interface.

7 Claims, 5 Drawing Sheets

U.S. PATENT DOCUMENTS

| | | | |
|---|---|---|---|
| 2004/0193969 A1* | 9/2004 | Nemoto et al. | 714/100 |
| 2005/0044290 A1* | 2/2005 | Ishii | 710/33 |
| 2005/0060452 A1* | 3/2005 | Rengarajan | 710/107 |
| 2005/0108473 A1* | 5/2005 | Le Moal et al. | 711/113 |
| 2005/0144223 A1* | 6/2005 | Yang et al. | 709/203 |
| 2005/0149937 A1* | 7/2005 | Pilkington | 718/102 |
| 2006/0236033 A1* | 10/2006 | Guinn et al. | 711/118 |
| 2007/0101027 A1* | 5/2007 | Li et al. | 710/32 |
| 2007/0174719 A1* | 7/2007 | Inoue et al. | 714/42 |
| 2008/0005621 A1* | 1/2008 | Bedwani et al. | 714/43 |
| 2009/0204852 A1* | 8/2009 | Diggs et al. | 714/42 |

OTHER PUBLICATIONS

'An Introduction to the InfiniBand Architecture' by Pentakalos, O'Reilly Network, Feb. 4, 2002.*

'HyperTransport I/O Technology Overview, An Optimized, Low-latency Board-level Architecture' White Paper Rev. 001, The HyperTransport Consortium, Jun. 2004.*

Computer Bus reference article from the English Wikipedia, Jul. 24, 2004.*

* cited by examiner

SEMICONDUCTOR STORAGE DEVICE AND STORAGE SYSTEM

BACKGROUND

1. Technical Field

The invention relates to a semiconductor storage device and a storage system.

2. Description of the Related Art

A hard disk drive (HDD) may be connected to a server through a SCSI (Small Computer System Interface) bus.

In this storage system, an internal signal of the server is converted into a signal conformable to the SCSI bus by protocol conversion, and connected to the HDD.

SUMMARY

According to an aspect of the invention, a semiconductor storage device includes an external input/output port. A system bus of a server, which is extended to outside of the server, is connected to the external input/output port directly as a serial interface.

BRIEF DESCRIPTION OF THE DRAWINGS

Exemplary embodiments of the invention will be described in detail based on the following figures, wherein.

DETAILED DESCRIPTION

First Exemplary Embodiment

Figure 1:
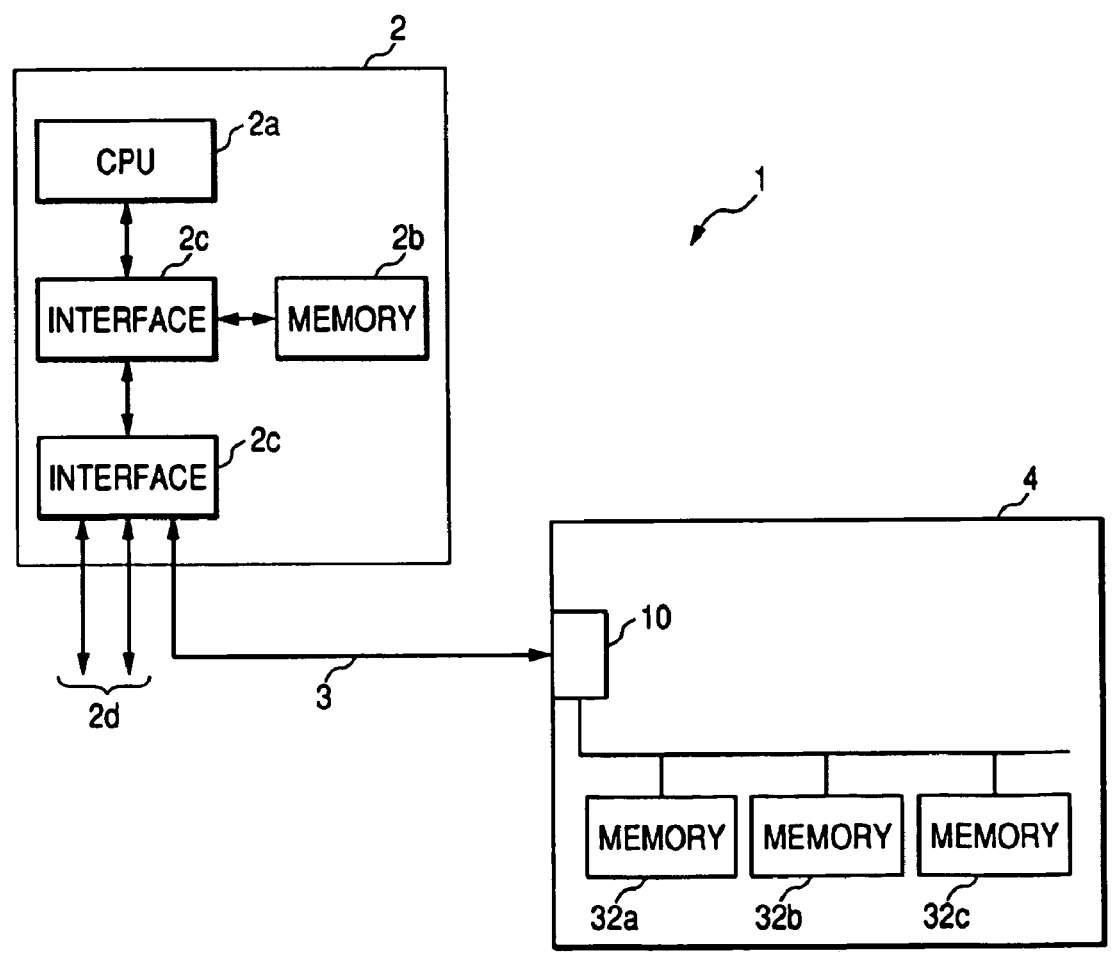
FIG. 1 is a block diagram showing a storage system according to a first exemplary embodiment of the invention.

FIG. 1 shows a storage system according to a first exemplary embodiment of the invention. In this storage system 1, a server 2 and an external input/output port 10 of a semiconductor storage device 4 are connected through a system bus 2*d*, which is extended to outside of the server 2, as a fast serial interface 3 performing no protocol conversion. The system bus 2*d*, such as a peripheral bus, a memory bus and an internal bus, connects a CPU 2*a*, a memory 2*b*, etc. in the server 2 through an interface 2*c*.

Figure 2:
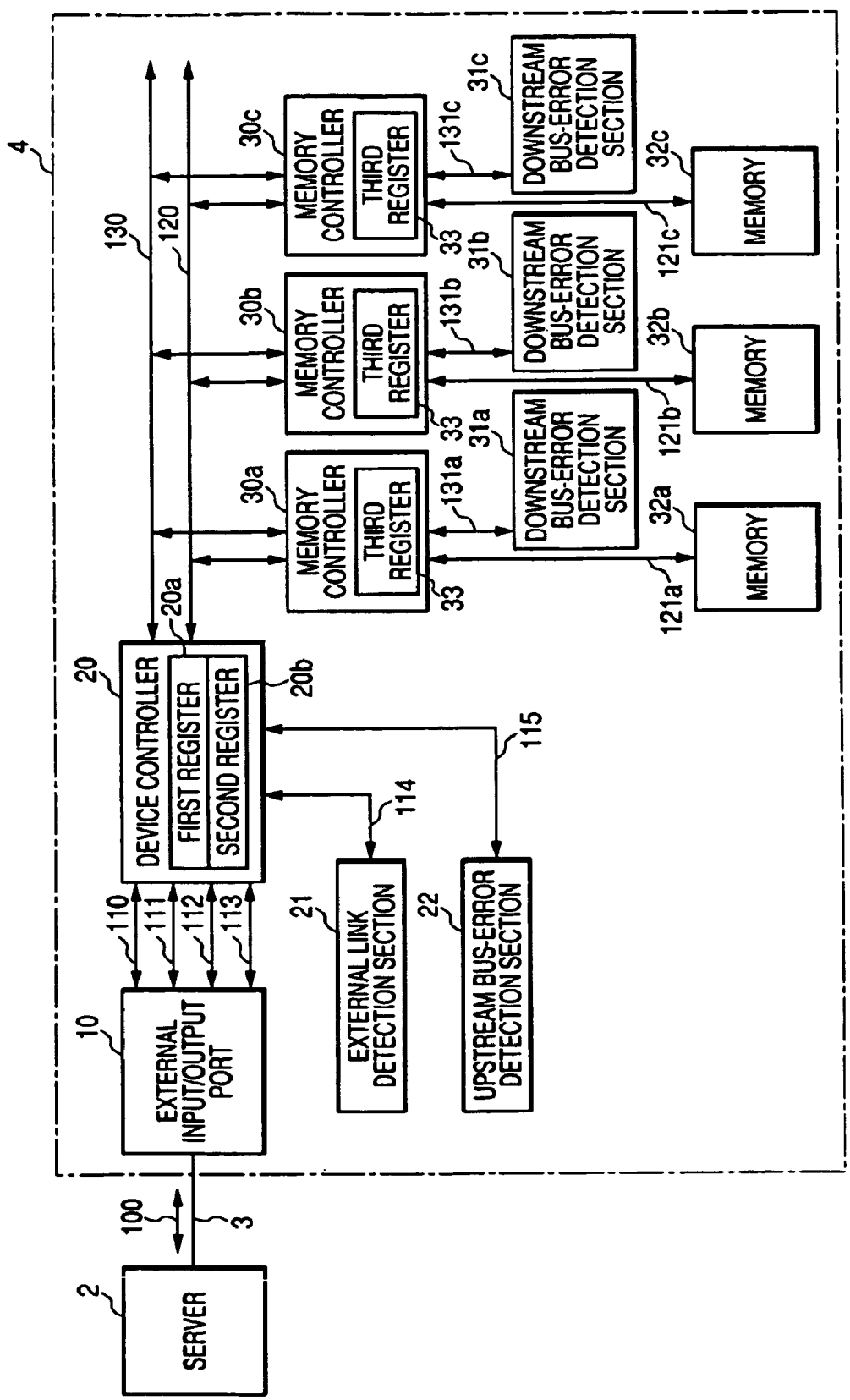
FIG. 2 is a block diagram showing an internal configuration of a semiconductor storage device shown in FIG. 1.

FIG. 2 shows an internal configuration of the semiconductor storage device. This semiconductor storage device 4 has the external input/output port 10, a device controller 20, an external link detection section 21, an upstream bus-error detection section 22, memory controllers 30, downstream bus-error detection sections 31, memories 32 (32*a*, 32*b* and 32*c*), a memory bus 120 and a control bus 130.

A fast interface (I/F) such as PCI Express (registered trademark), HyperTransport (registered trademark), NumaLink (registered trademark), etc. may be used as the serial interface 3. In this configuration, however, there is a risk of halt of the server 2 in the worst case when there occurs a transmission error on the serial interface 3 or when there occurs an error in the semiconductor storage device 4. Thus, there is a fear that reliability cannot be secured in the system as a whole. In this exemplary embodiment, therefore, transmission error is detected and a process for dealing with the transmission error is detected as will be described later.

The external input/output port 10 converts external input/output signals 100 received through the serial interface 3 into independent signals 110-113 respectively, so as to perform input/output with the device controller 20. The external input/output signals 100 correspond to a plurality of independent serial transmission links with the server 2. In this exemplary embodiment, the external input/output signals 100 are composed of four independent serial transmission links, and four signals (signals 110-113) are set between the external input/output port 10 and the device controller 20. The number of signals is not limited, but it may be one or any other.

The device controller 20 manages the external interface and controls the memory bus 120 and the control bus 130. The memory controllers 30 manage interfaces with the memories 32 respectively. The device controller 20 connects with the server 2 using a predetermined number of links of serial transmission links successful in connection on initializing.

The external link detection section 21 detects serial transmission links which have established connections with the server 2. The upstream bus-error detection section 22 has a correction/detection circuit, and detects an upstream transmission error. Each downstream bus-error detection section 31 has a correction/detection circuit, and detects a downstream transmission error.

Volatile memories such as DRAM, SRAM, etc. or nonvolatile memories may be used as the memories 32. Three memories 32 are connected in FIG. 2. However, the number of memories 32 is not limited to three.

(Operation of First Exemplary Embodiment)

Next, the operation of the first exemplary embodiment will be described according to circumstances.

(1) On Connecting

As soon as this device 4 is connected to the server 2, first the server 2 checks connection of each serial transmission link. The external input/output port 10 connects the external input/output signals 100 from/to the server 2 with the internal signals 110-113. The device controller 20 receives the signals 110-113 from the external input/output port 10, and obtains sync signals from the signals 110-113. Each sync signal obtained thus is output to the external link detection section 21 as a signal 114.

Based on the signal 114, the external link detection section 21 determines whether connection between each serial transmission link and the server 2 has been established or not. The result of the determination is output to the device controller 20. The device controller 20 stores the result of the determination from the external link detection section 21 into a first register 20*a* provided internally in the device controller 20. The first register 20*a* can be accessed externally.

In the PCI Express standard version 1.0a, serial transmission links having a transmission band of 2.5 Gbps are bundled in units of one lane, four lanes or eight lanes so as to form one input/output port. For example, assume that when connections using four lanes are checked, connection with one lane is failed for some reason, while connections with the other three lanes are successful. In this case, transmission till then will be performed using only one lane of the three successful lanes (because there is no standard for making communication using three lanes). For example, when this device 4 cannot operate without using four lanes, it is necessary to detect such a situation and establish connection with the server 2 again. The external link detection section 21 is provided for that case.

(2) On Initializing

On initializing the device 4, the device controller 20 transmits a test signal to the memory bus 120 and the control bus 130 so as to check upstream transmission between the device controller 20 and each memory controller 30. That is, the upstream bus-error detection section 22 determines whether there has occurred a transmission error or the like on reception of the upstream test signal, and outputs a result of the determination to the device controller 20. The device controller 20 stores the result of the determination from the upstream bus-error detection section 22 into a second register 20b which can be accessed externally.

Each memory controller 30 checks downstream transmission between the device controller 20 and the memory controller 30. That is, the downstream bus-error detection section 31 determines whether there has occurred a transmission error or the like on reception of the downstream test signal, and outputs a result of the determination to the memory controller 30. The memory controller 30 stores the result of the determination from the downstream bus-error detection section 31 into a third register 33 which can be accessed externally through the control bus 130. The control bus 130 is a bus slower and more reliable than the memory bus 120. Therefore, access to the register is gained through the control bus 130.

(3) On Normal Operation

The upstream bus-error detection section 22 and the downstream bus-error detection sections 31 have transmission error correction/detection circuits respectively. Not only on initializing the device 4 but also on normal operation, the upstream bus-error detection section 22 and the downstream bus-error detection sections 31 detect transmission errors and perform processing similar to that on initializing.

(4) Processing after Error Detection

Errors detected by the external link detection section 21, the upstream bus-error detection section 22 and the downstream bus-error detection sections 31 are stored in the first to third registers 20a, 20b and 33 which can be accessed externally. The device controller 20 reads the contents of the registers 20a, 20b and 33. When the contents of the registers 20a, 20b and 33 include a fatal error, the device controller 20 terminates data transmission forcedly at once, and transmits an error interrupt signal to the server 2 as the external input/output signal 100. Device drivers mounted in the server 2 may read the contents of the registers 20a, 20b and 33 periodically and terminate data transmission when an error is detected.

Second Exemplary Embodiment

Figure 3:
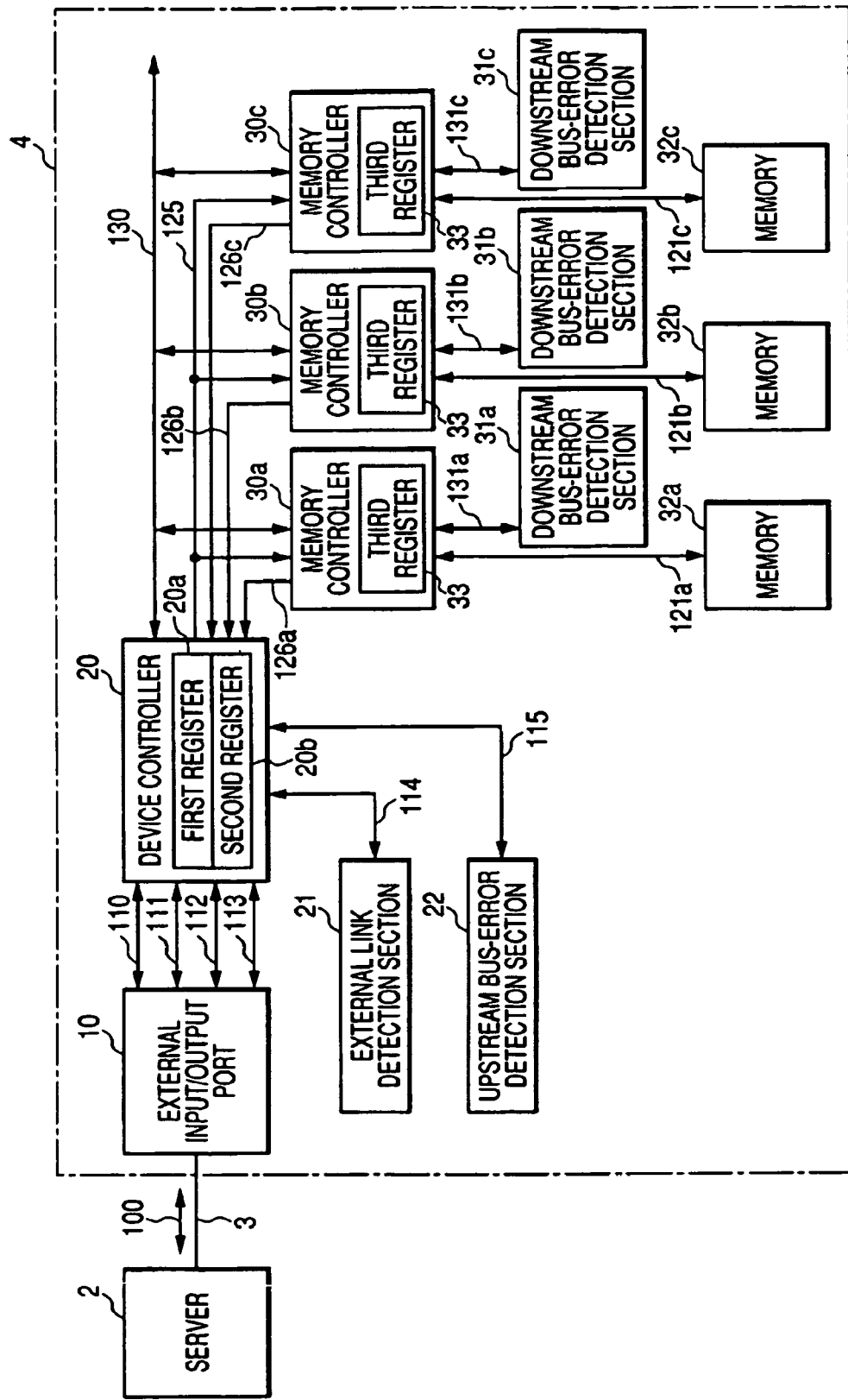
FIG. 3 is a block diagram showing an internal configuration of a semiconductor storage device according to a second exemplary embodiment of the invention.

FIG. 3 shows a semiconductor storage device according to a second exemplary embodiment of the invention. This exemplary embodiment is configured in the same manner as the first exemplary embodiment, except that the memory bus 120 is replaced by a downstream memory bus 125 and upstream memory buses 126. According to this configuration, one-to-one-correspondence connection is established between each memory controller 30 and the device controller 20 as to upstream transmission. It is therefore possible to read the memories concurrently.

Third Exemplary Embodiment

Figure 4:
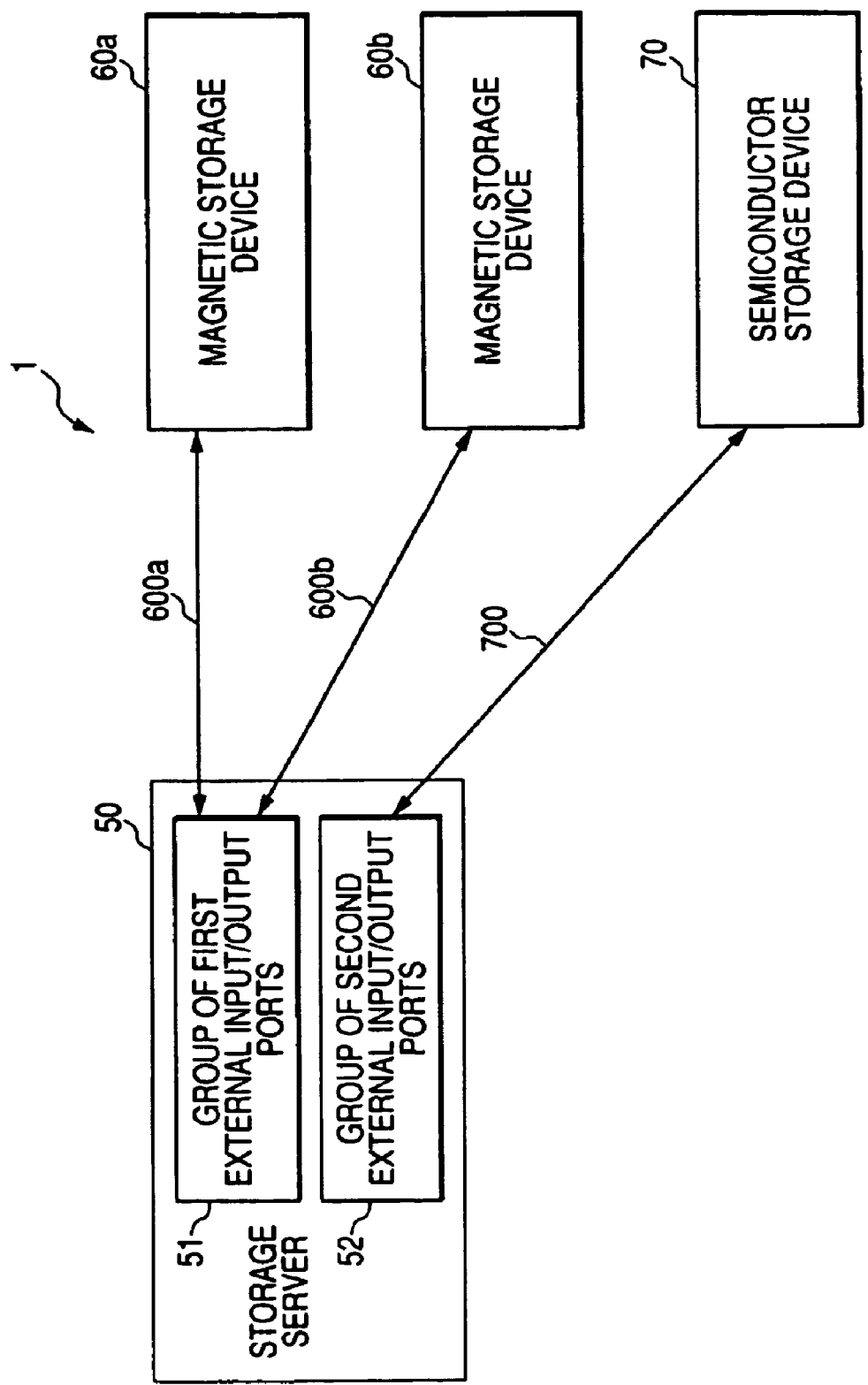
FIG. 4 is a block diagram showing a storage system according to a third exemplary embodiment of the invention.

FIG. 4 shows a storage system according to a third exemplary embodiment of the invention. This storage system 1 has a storage server 50, magnetic storage devices 60, and a semiconductor storage device 70 which is configured in the same manner as the semiconductor storage device 4 according to the first or second exemplary embodiment. One semiconductor storage device 70 is connected in FIG. 4. However, a plurality of semiconductor storage devices 70 may be connected.

The storage server 50 has a group of first external input/output ports 51 for connecting the two magnetic storage devices 60a and 60b through first interfaces 600a and 600b respectively, and a group of second external input/output ports 52 for connecting the semiconductor storage device 70 through a second interface 700.

The transmission band per port in the group of second external input/output ports 52 is set to be higher than the transmission band per port in the group of first external input/output ports 51. PCI Express, Hyper Transport, NumaLink, etc. may be used as the second interface 700, and Fiber Channel, SCSI, etc. may be used as the first interfaces 600a and 600b. The second interface 700 is also arranged by extending a system bus in the storage server 50 externally through the group of second external input/output ports 52 in the same manner as in the first exemplary embodiment.

The magnetic storage devices 60 may be replaced by any storage devices other than semiconductor ones. For example, the magnetic storage devices 60 may be replaced by optical disks, magnetic tapes, or the like.

The semiconductor storage device 70 is used for storing data which will be more frequently accessed than data stored in the magnetic storage devices 60, as will be described later. Thus, the storage server 50 can be expected to have high performance. To this end, it is necessary to connect the semiconductor storage device 70 through an interface having a high transmission band.

When data are stored in the semiconductor storage device 70, two methods can be used. One is a method in which the semiconductor storage device 70 is used as an external storage device, and the other is a method in which the semiconductor storage device 70 is used as a cache memory for the magnetic storage devices.

(a) Method for Use as External Storage Device

In this case, the semiconductor storage device 70 is used for storing a swap file (also referred to as a page file). The swap file means a file prepared on a storage in order to save an unused memory region temporarily. When the memory capacity mounted on the server is smaller than required memory capacity, a large swap file is formed, and data are frequently exchanged between the memory and the swap file. Thus, the total performance deteriorates. Even in such a situation, when the swap file is stored in the semiconductor storage device 70, it is possible to obtain performance as high as that when the memory capacity is expanded.

(b) Method for Use as Cache Memory for Magnetic Storage Devices

The semiconductor storage device 70 is used as a cache memory for temporarily storing frequently accessed ones of data stored in the magnetic storage devices 60. Means (cache control unit) for implementing cache control to implement the cache memory include a method using a cache controller provided in one of the storage server 50, the semiconductor storage device 70 and the magnetic storage devices 60, a method using software processing by the CPU of the storage server 50, etc. The device controller 20 or each memory controller 30 of the semiconductor storage device 70 has a function as a block-address retrieval processing unit for checking whether or not there is a cache hit about a block to be accessed.

Figure 5:
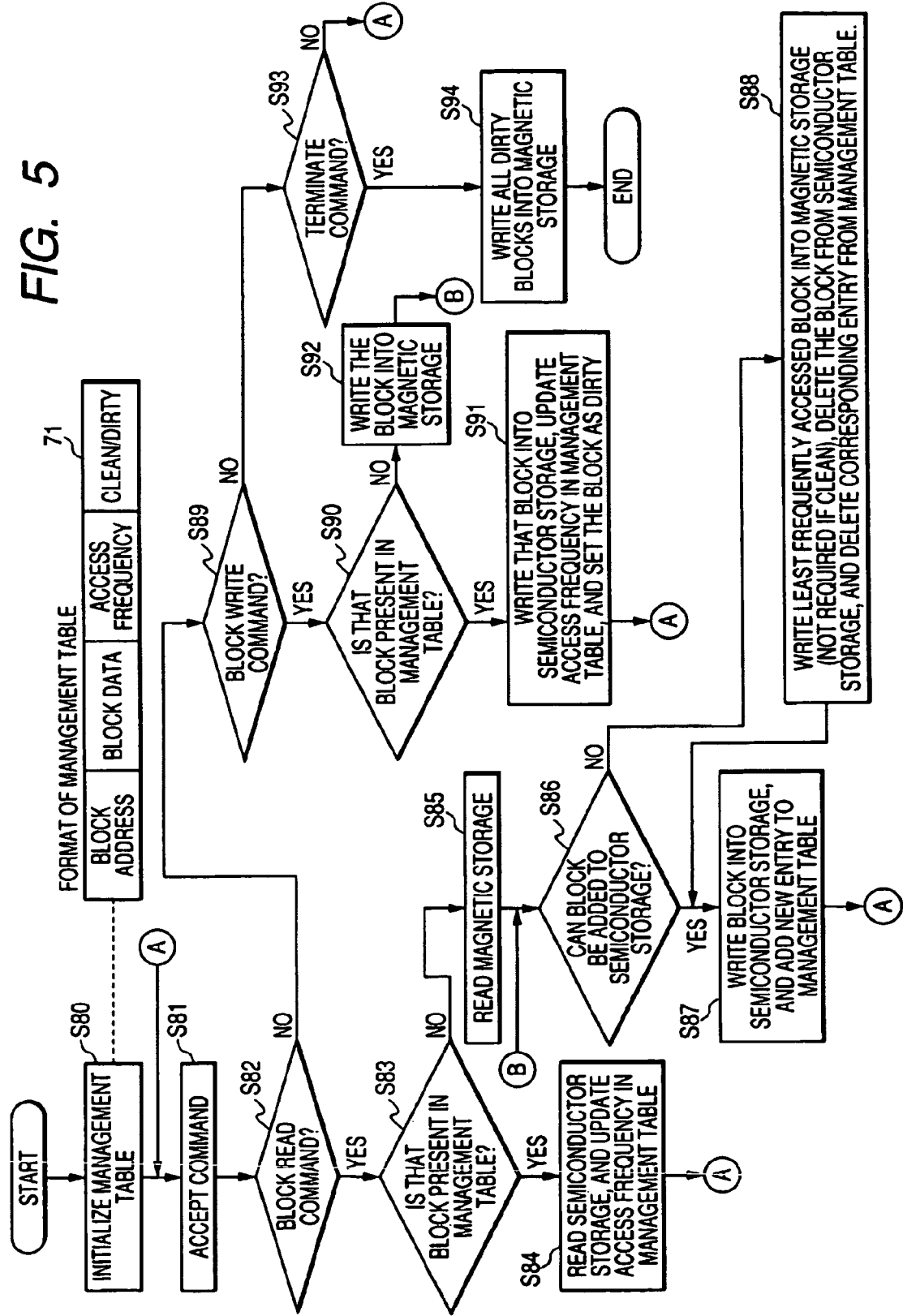
FIG. 5 is a flowchart showing the operation of the storage system according to the third exemplary embodiment of the invention.

FIG. 5 shows a flow chart of a method for using the semiconductor storage device 70 as a cache memory for the magnetic storage devices, together with a management table stored in the semiconductor storage device 70.

Information about each block, that is, four pieces of attribute information of a block address, block data, an access frequency, and dirty/clean are registered in the management table 71 stored in the semiconductor storage device 70. The word "clean" means that block data in the semiconductor storage device 70 match block data in the magnetic storage device 60. The block data become dirty when only the block data in the semiconductor storage device 70 are updated. When the table is initialized or when new data are written into the semiconductor storage device 70, the access frequency is set to be zero as a default value of the attribute, and the attribute dirty/clean is set to be clean as default. In addition to the aforementioned attributes, other attributes such as an access time, a user attribute, etc. may be added to the format of the management table 71.

In the method using a cache controller, the management table 71 is provided in a memory 32 which can be accessed from the cache controller. In the method using software processing by the CPU of the storage server 50, the management table 71 is provided in the memory on the storage server 50.

Assume that a block read command, a block write command or a terminate command is given. The writing system is roughly classified into a write-through system (updating the cache memory and the magnetic storage device 60 at the same timing) and a write-back system (updating only the cache memory and updating the magnetic storage device 60 at the timing when a block in question is turned out from the cache memory). Here, the write-back system is assumed in the flow chart.

After the management table 71 is initialized (S80), a command is accepted (S81). When the accepted command is a block read command (S82: Yes), whether or not there is a hit on the cache memory implemented in the semiconductor storage device 70 is checked with reference to the management table 71 (S83). When there is a hit (S83: Yes), the semiconductor storage device 70 is accessed, a block in question is read therefrom, and the access frequency in the management table 71 is updated (S84).

When there is no hit in Step S83 (S83: No), the magnetic storage device 60 is accessed (S85), and the semiconductor storage device 70 is updated. That is, it is determined whether a block can be added to the semiconductor storage device 70 or not (S86). When the block can be added (S86: Yes), the block is written into the semiconductor storage device 70, and information about the block is newly added to the management table 71 (S87). When the block cannot be added (S86: No), a block the least frequently accessed is written into the magnetic storage device 60 (not required if clean), and deleted from the semiconductor storage device 70, and a corresponding portion of the management table 71 is also deleted (S88).

When the accepted command is not a block read command in Step S82 (S82: No) but a block write command (S89: Yes), whether or not there is a hit on the cache memory implemented in the semiconductor storage device 70 is checked with reference to the management table 71 (S90). When there is a hit (S90: Yes), the semiconductor storage device 70 is accessed, and a block is written therein. The access frequency in the management table 71 is updated, and the block is set as dirty (S91).

When the accepted command is not a block write command in Step S89 (S89: No), it is determined whether the command is a terminate command or not (S93). When the command is a terminate command (S93: Yes), all the blocks regarded as dirty are written into the magnetic storage device 60 (S94).

When the processing of Steps S83 and S90 is carried out by the device controller 20 or each memory controller 30 built in the semiconductor storage device 70, the processing can be performed at a high speed. Specifically, whether a block address externally given by a block read command or a block write command is present in the management table 71 or not is checked by retrieval, hashing or the like.

In Step S88, the least frequently accessed block is turned out from the cache memory. However, any algorithm for deciding which block to be turned out may be used. For example, an LRU (Least Recently Used) algorithm or the like may be applied.

The method for notifying the server of an error may be based on a method using interruption from the semiconductor storage device or a method in which an address is read periodically by the server.

Other Exemplary Embodiments

The invention is not limited to the aforementioned exemplary embodiments. Various modifications can be made on the invention without departing from its scope and spirit. In addition, constituent parts of the exemplary embodiments can be combined desirably without departing from the scope and spirit of the invention.

In the configuration of FIGS. 2 and 3, an optical bus may be used as each memory bus. In this case, an incoming optical fiber, an optical waveguide and a plurality of outgoing optical fibers are connected optically. An electro-optic converter is disposed on the incoming side of the incoming optical fiber, and an opto-electric converter is disposed on the outgoing side of each outgoing optical fiber. Thus, the noise resistance is improved so that the reliability is further enhanced.

What is claimed is:

1. A semiconductor storage device comprising:

an external input/output port to which a system bus of a server, which is extended to outside of the server without protocol conversion, is connected directly as a serial interface;

a device controller that connects to the server using predetermined number of links among serial transmission links of the serial interface, which are successful in connection on initialization; wherein:

the device controller comprises:

an external link detection section that detects the serial transmission links, which are successful in connection; and a first register that stores a detection result of the external link detection section, the first register that can be accessed from outside of the device;

a memory controller connected to the device controller through a control bus and a memory bus, wherein:

the memory controller comprises:

a downstream bus-error detection section that detects an error in downstream transmission in the memory bus;

a memory error detection section that detects an error relating to access to a memory; and a third register that stores a detection result of the downstream bus-error detection section and a detection result of the memory error detection section, the third register that can be accessed from the outside of the device, through the control bus, the device controller further comprises:
an upstream bus-error detection section that detects an error in upstream transmission in the memory bus; and
a second register that stores a detection result of the upstream bus-error detection section, the second register that can be accessed from the outside of the device, and when information read from registers includes a fatal error, the device controller terminates data transmission forcedly at once, and transmits an error interrupt signal to the server as an external input/output signal.

2. The device according to claim 1, wherein the device controller reads contents of the first to third registers, terminates data transmission when a predetermined bit is valid, and outputs an error interrupt signal to the server.

3. The device according to claim 1, wherein the serial interface is based on a differential transmission system using two signal lines as one lane.

4. A storage system comprising:
a storage server; and
a semiconductor storage device connected to the storage server, wherein:
the semiconductor storage device comprises:
an external input/output port to which a system bus of the server, which is extended to outside of the server without protocol conversion, is connected directly as a serial interface;
a device controller that connects to the server using predetermined number of links among serial transmission links of the serial interface, which are successful in connection on initialization; and
a memory controller connected to the device controller through a control bus and a memory bus;
the device controller comprises:
an external link detection section that detects the serial transmission links, which are successful in connection;
a first register that stores a detection result of the external link detection section, the first register that can be accessed from an outside of the device controller;
an upstream bus-error detection section that detects an error in upstream transmission in the memory bus; and
a second register that stores a detection result of the upstream bus-error detection section, the second register that can be accessed from the outside of the device controller,
the memory controller comprises:
a downstream bus-error detection section that detects an error in downstream transmission in the memory bus;
a memory error detection section that detects an error relating to access to a memory; and
a third register that stores a detection result of the downstream bus-error detection section and a detection result of the memory error detection section, the third register that can be accessed from an outside of the memory controller, through the control bus, and when information read from registers includes a fatal error, the device controller terminates data transmission forcedly at once, and transmits an error interrupt signal to the server as an external input/output signal.

5. A storage system comprising:
a storage server;
a semiconductor storage device connected to the storage server; and
a magnetic storage device, wherein:
the semiconductor storage device comprises an external input/output port to which a system bus of the server, which is extended to outside of the server without protocol conversion, is connected directly as a serial interface,
the storage server comprises:
a first external input/output port that connects to the magnetic storage device;
a second external input/output port that connects to the semiconductor storage device; and
a cache control unit that causes the semiconductor storage device to function as cache memory for the magnetic storage device,
a transmission band per port in the second external input/output port is higher than that in the first external input/output port,
the cache control unit is implemented by software on the storage server,
the semiconductor storage device comprises a block-address retrieval processing unit that checks whether or not there is a cache hit about a block to be accessed, and
when information read from registers includes a fatal error, a device controller terminates data transmission forcedly at once, and transmits an error interrupt signal to the server as an external input/output signal.

6. The system according to claim 5, wherein:
when detecting an error interrupt signal from the second external input/output port, the storage server terminates data transmission relating to the pertinent semiconductor storage device.

7. The system according to claim 5, wherein the block-address retrieval processing unit is provided in the device controller or the memory controller.

* * * * *